(12) United States Patent
Boerstler et al.

(10) Patent No.: US 6,507,228 B2
(45) Date of Patent: Jan. 14, 2003

(54) METHOD AND APPARATUS FOR LATCHING A CLOCKED DATA SIGNAL

(75) Inventors: David William Boerstler, Round Rock, TX (US); Osamu Takahashi, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/848,165

(22) Filed: May 3, 2001

(65) Prior Publication Data

US 2002/0163372 A1 Nov. 7, 2002

(51) Int. Cl.[7] .............................................. H03K 3/037
(52) U.S. Cl. ...................................... 327/199; 327/212
(58) Field of Search ............................... 327/199, 201, 327/203, 212, 218, 200–209

(56) References Cited

U.S. PATENT DOCUMENTS

| | | | |
|---|---|---|---|
| 5,508,648 A | 4/1996 | Banik | 327/203 |
| 5,625,308 A | 4/1997 | Matsumoto et al. | 327/203 |
| 5,650,735 A * | 7/1997 | Ko | 326/93 |
| 5,751,649 A * | 5/1998 | Kornachuk et al. | 365/189.05 |
| 5,764,089 A * | 6/1998 | Partovi et al. | 327/200 |
| 5,825,225 A | 10/1998 | Sugisawa et al. | 327/208 |
| 6,084,455 A * | 7/2000 | Matson | 327/200 |
| 6,275,071 B1 * | 8/2001 | Ye et al. | 326/93 |
| 6,292,407 B1 * | 9/2001 | Porter et al. | 326/30 |

OTHER PUBLICATIONS

Weste and Eshraghian, "Principles of CMOS VLSI Design", 2nd edition, Fig 5.55b, p. 328, 1993.
Weste and Eshraghian, "Principles of CMOS VLSI Design", 2nd edition, Fig 5.58, p. 331, 1993.

* cited by examiner

Primary Examiner—Kenneth B. Wells
Assistant Examiner—Cassandra Cox
(74) Attorney, Agent, or Firm—Anthony V. S. England; Casimer K. Salys

(57) ABSTRACT

A latch includes memory and pulldown circuitry coupled to nodes of the memory for pulling one of the nodes down responsive to data. The pulldown circuitry has gating circuitry for gating the pulling down responsive to a clock signal. The latch also has pull up circuitry coupled to the other one of the memory nodes. A first pull up circuitry section is operable to pull the other one of the memory nodes up to a high state responsive to data. The first pull up circuitry section includes second gating circuitry. The second gating circuitry is operable to gate the pulling up of the other one of the memory nodes responsive to a pull up circuitry clock signal. The first pull up circuitry section more quickly pulls up its memory node, so that the two nodes are pulled up and down at more nearly the same time.

18 Claims, 4 Drawing Sheets

METHOD AND APPARATUS FOR LATCHING A CLOCKED DATA SIGNAL

Cross-reference to Related Applications

This application is related to the following co-pending applications which are assigned to the same assignee as the present case and are hereby incorporated herein by reference:

application Ser. No. 09/820,506, "Multiphase Serializer," filing date Mar. 29, 2001 application Ser. No. 09/753,054, "Self-Correcting Multiphase Clock Recovery," filing date Dec. 28, 2000; and application Ser. No. 09/753,055, "Multiphase Clock Recovery Using D/Type Phase Detector," filing date Dec. 28, 2000.

BACKGROUND OF THE INVENTION

1. Field of the Invention

The present invention relates to clocked latches in electronic circuitry, and more particularly to such latches which are suitable for application with a high frequency clock.

2. Related Art

For high-speed communications systems, true/complement edge triggered latches are used extensively for sampling both data and clock signals. True/complement level sensitive latches are also used. To maximize data rate, both latch speed and skew between true and complement output signals must be minimal. Existing static latch designs show significant time differences between clock-to-true-output and clock-to-complement-output, since typically one output drives the other output. At very high speeds, the propagation delay through an inverter can be an appreciable portion of the cycle time or baud interval, and the skew between a signal and its complement can be increased or accumulated in subsequent stages. U.S. Pat. No. 5,825,225 shows a technique for boosting the speed of a latch, but it does not teach differential outputs with low skew. U.S. Pat. No. 5,625,308 shows a differential latch which combines a latch circuit with an analog differential amplifier, but it does not provide full rail to rail swing due to analog nature of the amplifier with biased active load devices which drop the signal down from Vdd.

FIG. 5 illustrates a prior art static latch 500. Weste and Eshraghian, Principles of CMOS VLSI Design, second edition, FIG. 5.55 b, page 328, 1993. In an initial condition for this latch 500, data is low, as is output node Q, and output node Q_bar is high. With data high, upon clock going high node Q_bar is immediately pulled low through the FET's that receive the data and clock signals; however, node Q is not immediately driven high. Instead, node Q is driven high only after node Q_BAR is pulled low and propagates through the cross-coupled inverter element, i.e., memory, between nodes Q and Q_bar. Likewise, with data low, upon clock going high node Q is immediately pulled low and node Q_bar is pulled high after propagation through the memory. This skew is problematic.

Dynamic latches suffer from the same skew problems as static latches and are difficult to interface with surrounding static circuits. Therefore a need exists for improvements in a fast, latch with low skew between complementary outputs.

SUMMARY

The foregoing need is addressed in the following invention, according to which, in one form, a latch includes a memory having two nodes and pulldown circuitry coupled to the nodes for pulling one of them down to a low state responsive to a data signal. The pulldown circuitry has gating circuitry for timing the pulling down responsive to a pulldown circuitry clock signal. The latch also has pull up circuitry, which has a first pull up circuitry section coupled to one of the memory nodes for pulling the node up to a high state responsive to a pull up circuitry data signal. The first pull up circuitry section includes second gating circuitry for timing the pulling up responsive to a pull up circuitry clock signal. It is an advantage that the first pull up circuitry section more quickly pulls up the node, so that one memory node is pulled down and the other one is pulled up at more nearly the same time.

In another aspect, the pull up circuitry has a second pull up circuitry section for pulling up the other one of the memory nodes responsive to the pull up circuitry clock signal and a complement of the pull up circuitry data signal. It is an advantage of including the second pull up circuitry section that the first and second memory nodes will each be pulled up, in respective instances, and that the pull up times will more nearly match the times for pulling down the complementary node in each instance.

In a further aspect, the latch has delay circuitry operable to assert and deassert a delay signal, responsive to a delay circuitry clock signal and to a delay interval. The pulling up and pulling down is enabled during the delay interval. After the delay interval the isolation circuitry of the latch isolates the memory nodes from pull up and pulldown voltages until the delay circuitry responds to a new state of the delay circuitry clock signal, at which time the gating circuitry isolates the nodes until the next change in state of the gating circuitry clock. It is an advantage to include the delay and isolation circuitry in the latch so that the state of the data signal is captured during a narrow and controllable window of time. In contrast, in a latch such as latch 500 of FIG. 5, the output of the latch 500 is responsive to changes in the data signal any time the clock signal is high.

In a still further aspect, the delay interval is longer in one instance than in another, depending on the state of the delay circuitry clock signal. This is advantageous since the longer delay permits the memory nodes to be more fully driven to their respective states before the isolation circuitry isolates the memory.

Other objects and advantages of the invention will become apparent upon reading the following detailed description and upon reference to the accompanying drawings.

BRIEF DESCRIPTION OF THE DRAWINGS

The novel features believed characteristic of the invention are set forth. in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

In the following detailed description of the preferred embodiments, reference is made to the accompanying drawings illustrating embodiments in which the invention may be practiced. It should be understood, however, that the drawings and detailed description are not intended to limit the invention to the particular form disclosed, but on the contrary, the intention is to cover all modifications, equivalents and alternatives falling within the spirit and scope of the present invention as defined by the appended claims.

Figure 1:
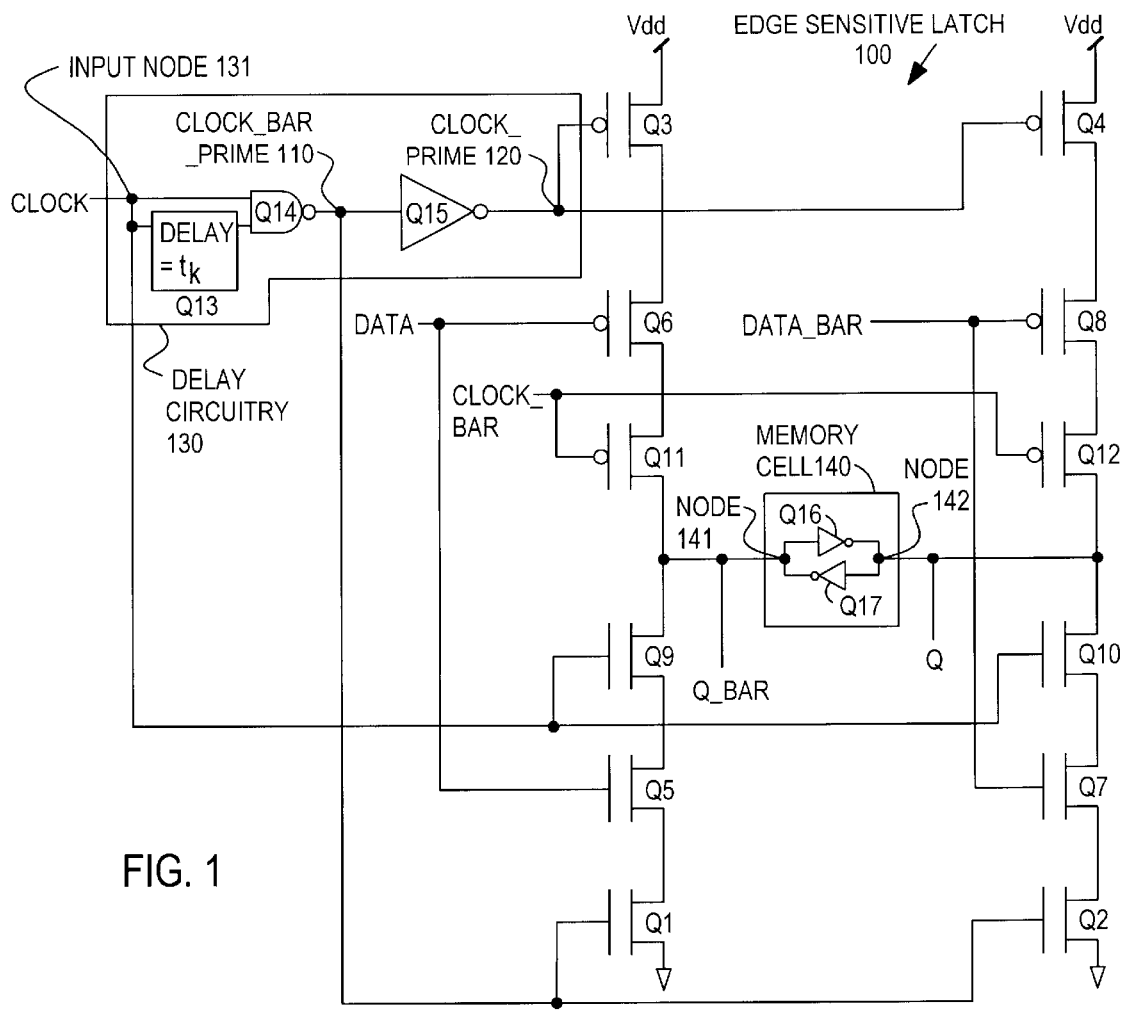
FIG. 1 shows an edge sensitive latch 100, according to an embodiment of the invention.

Referring to FIG. 1, an edge sensitive latch 100 is shown. The latch 100 includes a memory 140 with inverters Q16 and Q17, having a first node Q for storing a high or low state, and a second node Q_bar for storing a state complementary to that of node Q.

It should be noted that the states of the nodes Q and Q_bar may also be referred to as respective "output signals" Q and Q_bar for the latch 100. In general, the state of a node may be referred to as an input or output signal. And, likewise, an input or output signal may be referred to as the state of a node. Also, it may be said that a state or signal is "asserted" or "deasserted" on the node.

Clock related signals for the latch 100 are generated by delay circuitry 130 having an input node 131 for receiving a clock signal. The delay circuitry 130 is operable to assert a first delay signal, clock_bar_prime 110, responsive to the delay circuitry clock signal 131, and a first delay interval. The first delay interval includes a delay $t_k$ introduced by delay element Q13. That is, clock_bar_prime 110 is asserted the first delay interval after the delay circuitry clock signal 131 is asserted. Note that with the combination of the Nand gate Q14 and delay element Q13 as shown, the first delay interval, which includes interval $t_k$, is longer responsive to the delay circuitry clock signal going high than to the delay circuitry clock signal going low. That is, the clock signal is input directly to the Nand gate Q14 at one of the Nand gate Q14 inputs, but is delayed by element Q13 at the other one of the Nand gate Q14 inputs. Thus, when the clock signal falls clock_bar_prime 110 falls immediately in response to the direct clock signal input. But when the clock signal rises, clock_bar_prime 110 does not rise until both Q14 inputs have risen. Since one of the Q14 inputs is delayed by the $t_k$ of element Q13, this causes a delay in the Q14 output response. A reason for this will be described below in connection with FIG. 2.

It should be noted that the term "asserted" and "deasserted" will be used in a specific context for the FIG's described herein, but that the terms should not be limited to only those specific examples. The terms are used to avoid confusion when dealing with the mixture of "active high" and "active low" logic signals. "Assert" is used to refer to the rendering of a logic signal or register bit or node into its active, or logically true state. "Deassert" is used to refer to the rendering of a logic signal or register bit or node into its inactive, or logically false state. Depending on whether circuitry is applied in the context of "active high" or "active low" logic, a signal that is "asserted" maybe either a high voltage or a low voltage, and a signal that is "deasserted" may be either a low voltage or a high voltage. Thus in one context, circuitry for asserting may be circuitry for pulling a node up, and in another context, circuitry for asserting may be circuitry for pulling a node down.

The delay circuitry 130 is also operable to deassert a second delay signal, clock_prime 120, responsive to the first delay signal 110 and a second delay interval, i.e., the propagation delay interval of inverter Q15, after the first delay signal 110 is asserted. (Conversely, of course, the clock_prime signal 120 is asserted, with propagation delay by Q15, responsive to clock_bar_prime 110 being deasserted.) Note that since the second delay signal is triggered responsive to the first delay signal, it should be understood that an event triggered by the second delay signal is also responsive to the first delay signal and thus also to the first delay interval.

Figure 2:
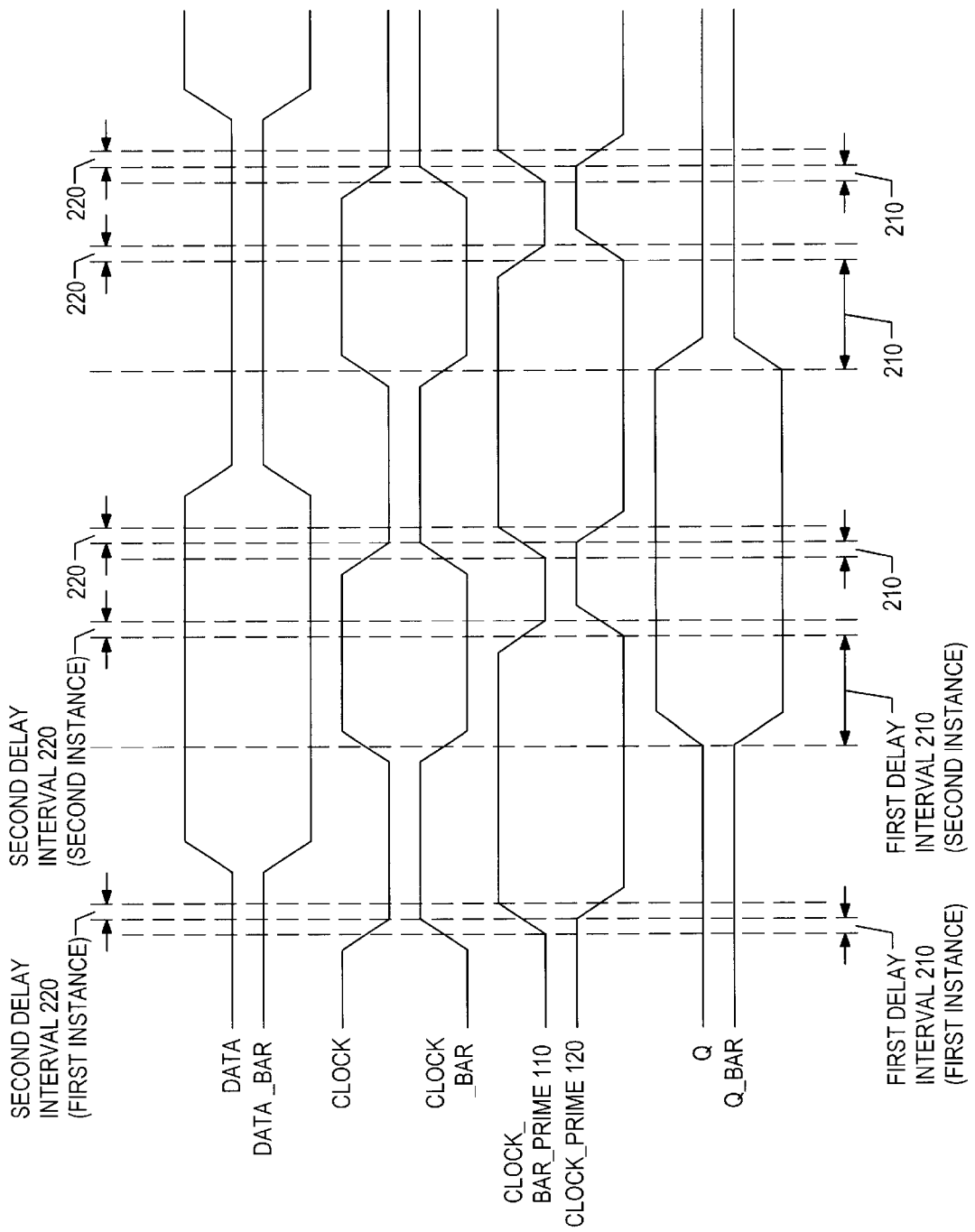
FIG. 2 indicates certain timing aspects of operation of the latch 100.

Referring now to FIG. 2, with reference also to FIG. 1, operation of the latch 100 will be described, according to an embodiment. It should be understood that the timing shown in FIG. 2 is generally illustrative a sequence of events and relative timing, but is not necessarily to scale.

When clock falls, and clock_bar rises, this immediately turns off FET's Q9–12, and a short while later, as shown at the first instance of the first delay interval 210, clock_bar_prime is asserted, which turns on Q1 and Q2. Then, after the second delay interval 220, clock_prime is deasserted, which turns on Q3 and Q4. However, since the FET's Q9–12 are off at this time, nodes Q and Q_bar are isolated for now, despite the turning on of Q1–4. Therefore, the nodes Q and Q_bar do not change state immediately when the data changes a short while later.

Then, after data has gone high and data_bar has gone low, when clock goes high and clock_bar goes low, node Q is immediately pulled up through FET's Q4, Q8 and Q12, gated, i.e., timed, by clock_bar falling. Likewise, Q_bar is immediately pulled down through the FET's Q1, Q5 and Q9, gated by clock rising.

Next, clock_bar_prime falls responsive to clock rising, as shown at the second instance of the first delay interval 210. Then clock_prime rises shortly thereafter responsive to clock_bar_prime falling, as shown at the second instance of the second delay interval 220. Clock_prime rising and clock_bar_prime falling turns off Q1 through Q4, isolating nodes Q and Q_bar from Vdd and ground, so they are held by the memory 140 and make no further changes despite any change in data.

Note that the first delay interval 210, i.e., the interval from clock changing state to clock_bar_prime 110 responsively changing state, is longer at the second instance than the first. This is because the delay interval 210 is responsive to the clock signal rising at the second instance and responsive to the clock signal falling at the first instance. This is advantageous since the longer delay permits the memory 140 nodes Q and Q_bar to be more fully driven to their respective states during the data capture window provided by the first delay interval 210 before the memory 140 is isolated. Note that duration of the data capture window provided by the first delay interval is controlled by the time constant $t_k$ of delay element Q13. This window can be adjusted by changing $t_k$.

Next, when clock again falls and clock_bar rises, this again immediately turns off FET's Q9–12, and a short while later clock_bar_prime is asserted turning on Q1 and Q2. Then, after the second delay interval 220, clock_prime is deasserted, which turns on Q3 and Q4. Once again, since the FET's Q9–12 are off at this time by clock and clock_bar, nodes Q and Q_bar are again isolated despite the turning on of Q1–4. With the memory nodes isolated responsive to clock and clock_bar, the nodes Q and Q_bar do not change state responsive to the change in data a short while later until clock rises again and clock_bar falls.

It should be understood that although not illustrated in FIG. 2, when data is low and clock goes high, Q_bar is pulled up through the FET's Q3, Q6 and Q11, gated by clock bar falling. Once again, clock_prime is already low when clock_bar falls, but clock_prime rises shortly thereafter, responsive to clock going high. Likewise, node Q is pulled down through the FET's Q2, Q7 and Q10, gated by clock rising. Once again, clock_bar_prime is already high when clock rises, but clock_bar_prime falls shortly thereafter, responsive to clock going high. As before, clock_prime rising and clock_bar_prime falling isolates nodes Q and Q_bar from Vdd and ground, so they are held by the memory 140 and make no further changes despite any change in data. And, as before, when clock falls, and clock_bar rises, this immediately turns off FET's Q9–12, and a short while later clock_bar_prime is asserted, and then clock_prime is deasserted, which turns on Q1–4 again, but since the FET's Q9–12 are off, nodes Q and Q_bar remain isolated until the next clock cycle, when the clock signal rises again.

Figure 3:
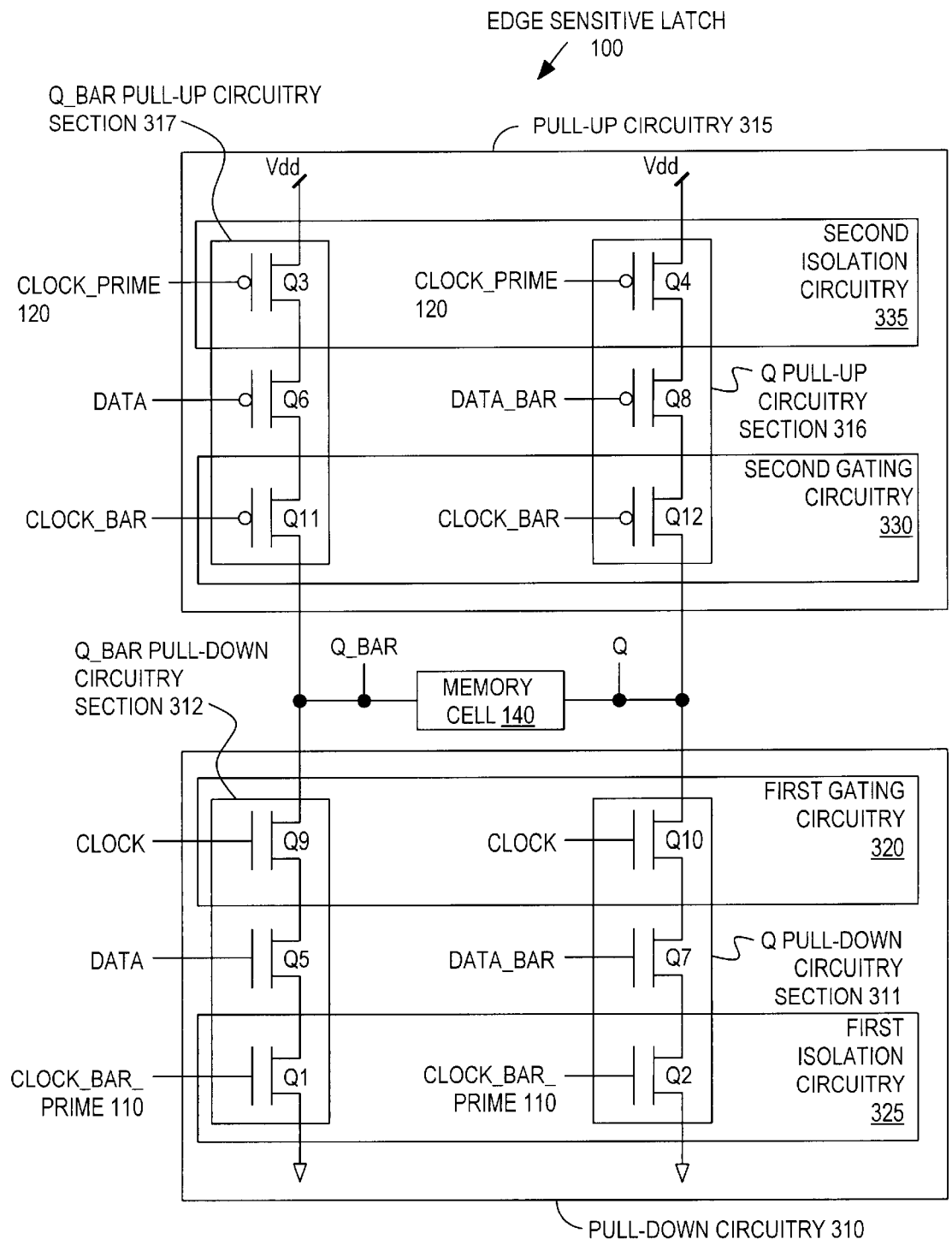
FIG. 3 illustrates a portion of the latch 100 of FIG. 1 again, with additional identification of certain circuitry sections.

Referring now to FIG. 3, a portion of the latch 100 of FIG. 1 is illustrated again, with additional identification of certain circuitry sections. The latch 100 has pulldown circuitry 310 coupled to the nodes Q and Q_bar for pulling one of the nodes, for example Q_bar, down to the low state responsive to the data signal received at the pulldown circuitry data input node coupled to the gate of Q5. The pulldown circuitry 310 has first gating circuitry 320 coupled to a pulldown circuitry clock signal input node, i.e., the gates of Q9 and Q10 are coupled to a signal clock signal input node as may be seen in FIG. 1, for gating the pulling down of the one of the memory nodes, for example, Q_bar.

The latch 100 also has pull up circuitry 315, which has a first pull up circuitry section, i.e., node Q pull up circuitry section 316, coupled to the other one of the memory nodes, Q. The pull up circuitry section 316 is operable to pull the other one of the memory nodes, Q, up to a high state responsive to the node Q pull up circuitry 316 data signal, data_bar, received at the data input node coupled to the gate of Q8 for the pull up circuitry section 316. The pull up circuitry section 316 includes second gating circuitry Q12 coupled to a clock input node, i.e., clock_bar coupled to the gate of Q12, for the pull up circuitry 316. The second gating circuitry Q12 is operable to gate the pulling up of the other one of the memory nodes, Q, responsive to the pull up circuitry clock signal, clock_bar. As previously stated, it is an advantage that the first pull up circuitry section 316 more quickly pulls up the memory node Q so that the pull up time for node Q more nearly matches the pull down time for Q_bar.

The pulldown circuitry 310 has a first pulldown circuitry section Q_bar pulldown circuitry section 312 for receiving the pulldown circuitry clock signal on the gate of Q9 and data signal on the gate of Q5, and a second pulldown circuitry section 311 for receiving the pulldown circuitry clock signal, i.e., the gate of Q10 is coupled to the gate of Q9 (as may be seen in FIG. 1), and for receiving a complement of the pulldown circuitry data signal, i.e., data_bar is received on the gate of Q7.

Also, the pull up circuitry 315 has a second pull up circuitry section, i.e., Q_bar pull up circuitry 317 for receiving the pull up circuitry clock signal, clock_bar, at the gate of Q11, and for receiving data, a complement of the pull up circuitry data signal on the gate of Q6. The second pull up circuitry section is operable to pull up the other one of the memory nodes, Q_bar, responsive to the pull up circuitry clock signal and data, the complement data signal.

In one embodiment, the latch 100 may omit the Q_bar pull up circuitry section 317, but it is advantageous to include the pull up circuitry section 317 because in this way the first and second memory nodes will each be pulled up, at respective instances, directly gated by the clock. This symmetry in operation reduces skew.

The pulldown circuitry 310 is coupled to the delay circuitry 130 (FIG. 1), and includes i) an input node for receiving the first delay signal, i.e., the gates of Q1 and Q2 are coupled to clock_bar_prime 110, and ii) first isolation circuitry 325 for isolating the memory from a pulldown voltage, i.e., ground, responsive to the first delay signal 110. The node Q pull up circuitry section 316 is coupled to the delay circuitry 130 and includes i) an input node for receiving the second delay signal, i.e., the gate of Q4 is coupled to clock_prime 120, and ii) second isolation circuitry, i.e., Q3 and Q4 are included in the second isolation circuitry 335 for pull up circuitry 315, but of these, only Q4 is included in the portion of the isolation circuitry 335 for the node Q pull up circuitry section 316. Q4 is for isolating the memory 140 node Q from a pull up voltage, Vdd, responsive to the second delay signal, clock_prime. The pulling up of the one of the memory nodes, Q, and the pulling down of the other one of the memory nodes, Q_bar, is enabled during the clock_bar_prime and clock_prime delay intervals, i.e., after clock_bar is deasserted and before clock_prime is deasserted. After the delay intervals, the first and second isolation circuitry 325 and 335 isolate the memory 140 nodes from the pull up and pulldown voltages until the delay circuitry 130 responds to a new state of the delay circuitry clock signal, i.e., the deasserted clock signal. During this isolation interval, node Q and Q_bar are held by the memory 140 and make no further changes despite any change in data. When clock is deasserted, and clock_bar is asserted, this immediately turns off the first and second gating circuitry 320 and 330. A short while later clock_bar_prime is asserted, and then clock_prime is deasserted, which resets first and second isolation circuitry 325 and 330 again. However, since the gating circuitry 320 and 330 are nonconductive, node Q and Q_bar remain isolated until the next clock cycle, when the clock signal rises again, turning on the first gating circuitry 320 and clock_bar signal falls again, turning on the second gating circuitry 330.

As described hereinabove, the first delay interval, i.e., the interval from clock changing state to clock_bar_prime 110 responsively changing state, is longer in one instance than another. That is responsive to the delay circuitry clock signal rising the first delay interval is longer, and responsive to the clock signal falling the first delay interval is shorter. This is advantageous since the longer delay permits the memory 140 nodes Q and Q_bar to be more fully driven to their respective states before the memory 140 is isolated by the first and second isolation circuitry.

Figure 4:
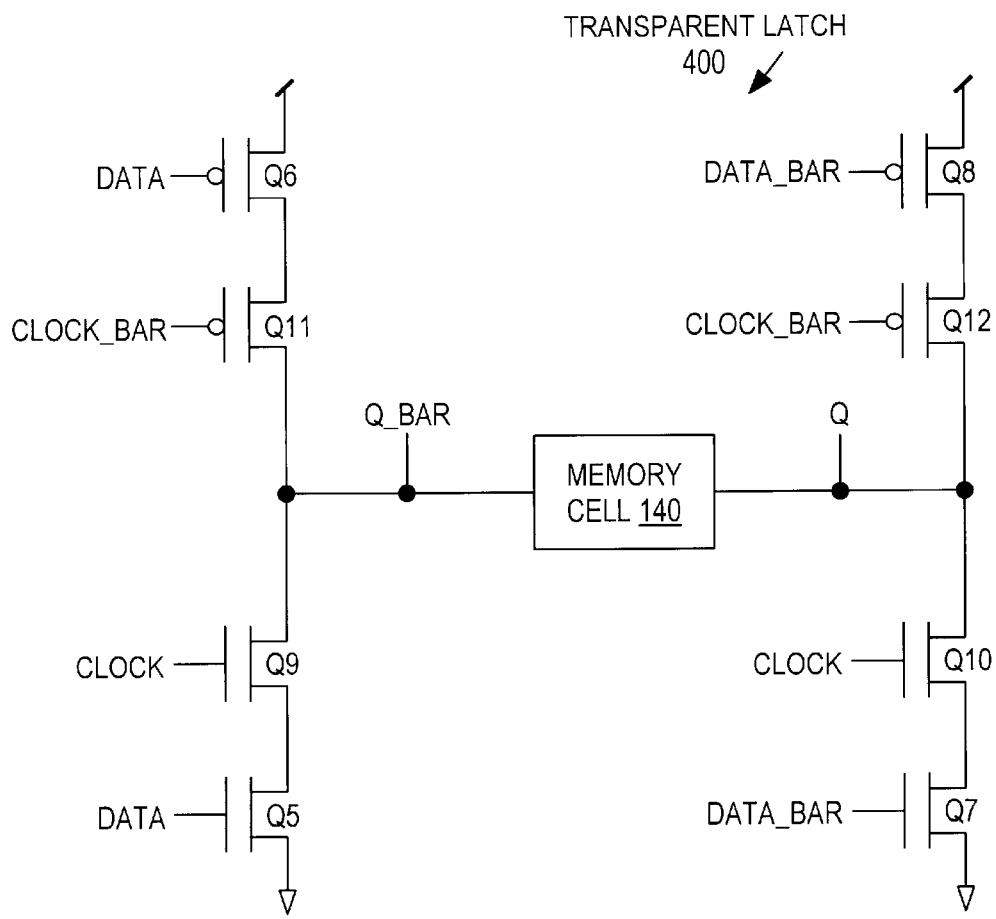
FIG. 4 illustrates a transparent latch 400, according to an alternative embodiment of the invention.
Figure 5:
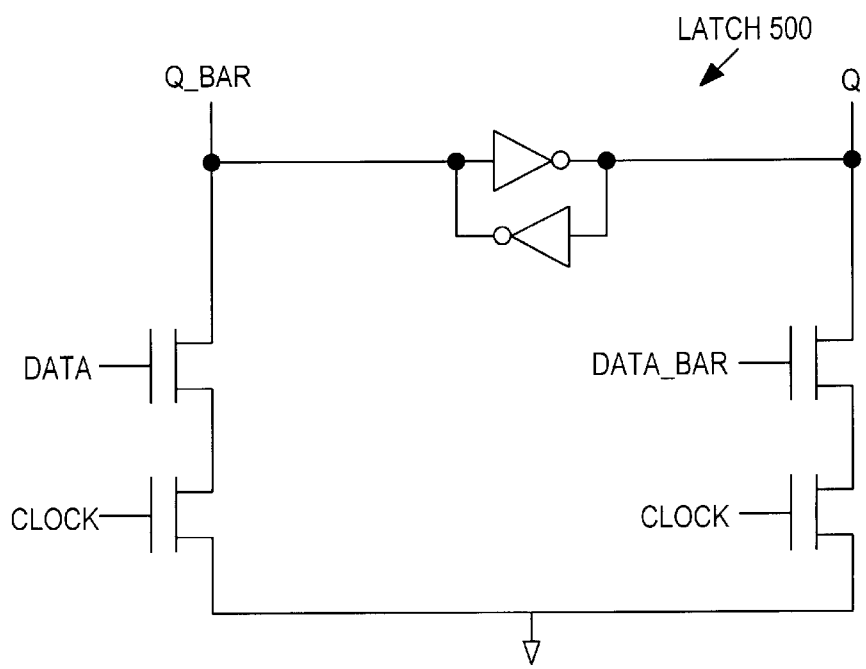
FIG. 5 illustrates a prior art latch 500.

FIG. 4 shows a transparent latch 400, according to an alternative embodiment of the present invention. The latch 400 is similar to latch 100 (FIG. 1) in many respects and provides some of the same advantages. Both latch 400 and latch 100 are different than latch 500 (FIG. 5), because in latch 400 and latch 100 one of the output nodes is pulled up and the other is pulled down almost simultaneously, whereas in latch 500 switching of one of the output nodes is driven by the other through the memory cell therebetween, so that there is more skew in the switching of the two output nodes for latch 500. Latch 400 differs from latch 100 in that latch 400 omits the delay circuitry 130 and the first and second isolation circuitry 325 and 335 of latch 100. With this configuration, as long as the clock signal is high, and clock_bar is low, the latch 400 is transparent, i.e., a change in data (and a corresponding change in data_bar) can change the state of the memory nodes Q and Q_bar. This is in contrast to latch 100 of FIG. 1, which provides a window of time, controlled by the delay element Q13, during which the latch will respond to data.

Figure 6:
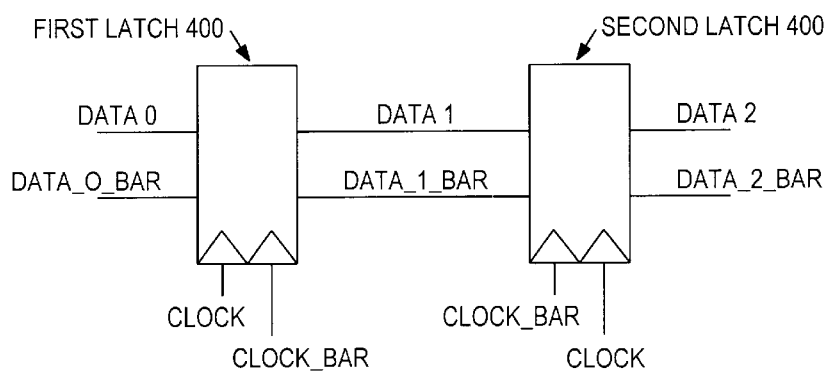
FIG. 6 illustrates a certain configuration of two of the latches 400, according to an embodiment of the invention.

FIG. 6 shows an arrangement of two latches 400 in series which avoids this transparency feature of the single latch 400. That is, since the first latch 400 captures data when the clock goes low, and holds the data while the clock stays low, and since the second latch captures data when the clock goes high, and holds the data will the clock stays high, the net effect of the two latches 400 in series is similar to that of latch 100. Whatever the first latch 400 captures when the clock falls is held by the second latch 400 when the clock rises until the clock falls again. Conversely, with the clock and clock_bar signals reversed and figure six, then whatever the first latch 400 captures when the clock rises is held by the second latch 400 when the clock falls until the clock rises again.

Those of ordinary skill in the art will appreciate that the hardware in the various FIG's may vary depending on the implementation. For example, delay circuitry 130 in FIG. 1 could be configured from different logic gates than those which are depicted. The depicted examples are not meant to imply undue limitations with respect to the present invention. The embodiments were chosen and described in order to best explain the principles of the invention, the practical application, and to enable others of ordinary skill in the art to understand the invention. Various other embodiments having various modifications may be suited to a particular use contemplated, but may be within the scope of the present invention.

What is claimed is:

1. A latch comprising:
   a memory of cross-coupled inverters having a first node for storing a high or low state, and a second node for storing a complement to the state;
   pulldown circuitry coupled to the first memory node for pulling the first node down to the low state responsive to a data signal received by the pulldown circuit, wherein the pulldown circuitry includes first gating circuitry coupled to a pulldown circuitry clock signal node for timing the pulling down of the first memory node during a data capture interval; and
   pull up circuitry having a first pull up circuitry section coupled to the second memory node for pulling the second memory node up to a high state responsive to a data signal received at the first pull up circuitry section, wherein the first pull up circuitry section includes second gating circuitry coupled to a pull up circuitry clock signal node for timing the pulling up of the second memory node during a data capture interval.

2. The latch of claim 1, wherein the pulldown circuitry has first pulldown circuitry section coupled to the first memory node for receiving the pulldown circuitry clock and data signals, and second pulldown circuitry section coupled to the second memory node for receiving the pulldown circuitry clock signal and a complement of the pulldown circuitry data signal, and wherein the pull up circuitry comprises:
   second pull up circuitry section coupled to the first memory node for receiving the pull up circuitry clock signal and a complement of the pull up circuitry data signal, and pull up the first memory node responsive to the pull up circuitry clock signal and the complement of the pull up circuitry data signal.

3. The latch of claim 1 comprising:
   delay circuitry, operable to assert and deassert a first delay signal responsive to a delay circuitry clock signal and responsive to a delay interval after the delay circuitry clock signal changes states, wherein the pulldown circuitry is coupled to the delay circuitry, and includes first isolation circuitry for isolating the first memory node from a pulldown voltage responsive to the delay signal, and wherein the pull up circuitry section is coupled to the delay circuitry and includes second isolation circuitry for isolating the second memory node from a pull up voltage responsive to the delay signal, so that the pulling up of the first memory node and the pulling down of the second memory node is enabled during the delay interval.

4. The latch of claim 3, wherein the first gating circuitry is operable to isolate the first memory node from the pull up voltage responsive to a low state of the pull up circuitry clock signal, and the second gating circuitry is operable to isolate the second memory node from the pulldown voltage responsive to a high state of the pulldown circuitry clock signal.

5. The latch of claim 4, wherein the pulldown circuitry is operable to receive a complement of the pull up circuitry clock signal.

6. The latch of claim 3, wherein the delay interval is longer responsive to the delay circuitry clock signal changing to a high state than a low state, so that the memory nodes are more fully driven to their respective states before the memory is isolated by the first and second isolation circuitry.

7. The latch circuitry of claim 1 comprising:
   a second memory having a second memory first node for storing a high and low state, and a second memory second node for storing a complement to the state;
   second pulldown circuitry coupled to the first and second memory nodes for pulling the first one of the second memory nodes down to a low state responsive to the first one of the first memory nodes, wherein the second pulldown circuitry includes third gating circuitry coupled to a second pulldown circuitry clock signal node for timing the pulling down; and
   second pull up circuitry coupled to the first and second memory nodes for pulling the second one of the second memory nodes up to a high state responsive to the second one of the first memory nodes, wherein the second pull up circuitry includes fourth gating circuitry coupled to a second pull up circuitry clock signal for timing the pulling up.

8. Latch circuitry comprising:
   a memory having a first node for storing a state and a second node for storing a complement to the first node state;
   deasserting circuitry coupled to the first memory node for deassert the fist memory node state responsive to a data signal received by the deasserting circuitry, wherein the deasserting circuitry has first gating circuitry coupled to a deasserting circuitry clock signal node for timing the deasserting; and
   first asserting circuitry having a first asserting circuitry section coupled to the second memory node for asserting the second memory node state responsive to a data signal received by the asserting circuitry, wherein the asserting circuitry section has second gating circuitry coupled to an asserting circuitry clock signal node for gating the asserting, wherein the deasserting circuitry comprises a first deasserting circuitry section for deasserting the first memory node state, and a second deasserting circuitry section for deasserting the second memory node state, and the second deasserting circuitry's first gating circuitry is coupled to a deasserting circuitry complementary clock signal node for timing the deasserting by the second deasserting circuitry, and wherein the apparatus comprises:

second assert circuitry section for asserting the first memory node state.

9. The latch circuit of claim 8 comprising:

delay circuitry, operable to assert a delay signal responsive to a delay circuitry clock signal and responsive to a delay interval after the delay circuitry clock signal switches states, wherein the deasserting circuitry is coupled to the delay circuitry, and includes first isolation circuitry for isolating the first memory node from a deassert voltage responsive to the delay signal, and wherein the asserting circuitry is coupled to the delay circuitry and includes second isolation circuitry for isolating the second memory node from an assert voltage responsive to the delay signal, so that the deasserting of the first memory node state by the deasserting circuitry and the asserting of the second memory node state by the asserting circuitry is enabled during the delay interval.

10. The latch circuitry of claim 8, wherein the first gating circuitry is operable to isolate the first memory node from the deassert voltage responsive to a state of the deassetting circuitry clock signal, and the second gating circuitry is operable to isolate the second memory node from the assert voltage responsive to the asset circuitry clock signal.

11. The latch circuitry of claim 10, wherein the deasserting circuitry is operable to receive a complement of the asserting circuitry clock signal.

12. The latch circuitry of claim 9, wherein the first delay interval is longer responsive to the delay circuitry clock signal switching to one state than to another state, so that the longer delay permits the memory nodes to be more fully driven to their respective states before the memory is isolated by the first and second isolation circuitry.

13. The latch circuitry of claim 8, comprising:

a second memory having a fist node for storing a state and a second node for storing a complement to the first node state;

second deasserting circuitry coupled to the second memory first and second nodes for deasseting the state on one of the second memory nodes responsive to one of the first memory nodes, wherein the second deasserting circuitry includes third gating circuitry coupled to a second deasserting circuitry clock signal node for timing the deasserting; and second asserting circuitry coupled to the second memory first and second nodes for asserting the signal on the other one of the second memory nodes responsive to the other one of the first memory nodes, wherein the second asserting circuitry includes second gating circuitry coupled to a second asserting circuitry clock node for timing the pulling up.

14. A method for latching a clocked data signal comprising the steps of:

deasserting, by deassenting circuitry of a first latch, a state of a first memory node of the latch responsive to a deassert circuitry data signal, wherein the deasserting is timed by first gating circuitry of the deasserting circuitry responsive to a deasserting circuitry clock signal; and asserting by a first asserting circuitry section of first asserting circuitry of the first latch, a complementary state of a second memory node of the first latch responsive to a first asserting circuitry section data signal, wherein the asserting is timed by second gating circuitry of the first asserting circuitry section responsive to an asserting circuitry clock signal;

asserting a delay signal by delay circuitry of the first latch responsive to a delay circuitry clock signal and a delay interval;

isolating the first memory node from a deassert voltage by first isolation circuitry of the deasserting circuitry responsive to the delay signal, and isolating the second memory node from an assert voltage by second isolation circuitry of the first asserting circuitry section responsive to the delay signal, so that during the delay interval the first memory node state is deasserted by the deasserting circuitry and the second memory node state is asserted by the asserting circuitry.

15. The method of claim 14, comprising the steps of:

isolating the first memory node from the deassert voltage by the first gating circuitry responsive to the deasserting circuitry clock signal; and isolating the second memory node from the assert voltage by the second gating circuitry responsive to the asserting circuitry clock signal.

16. The method of claim 14, wherein the delay interval is longer responsive to the delay circuitry clock signal switching to one state than another state, so that the longer delay permits the memory nodes to be more fully driven to their respective states before the memory nodes are isolated by the first and second isolation circuitry.

17. The method of claim 14, comprising the step of:

asserting the first memory node state by a second asserting circuitry section of the asserting circuitry responsive to the asserting circuitry clock signal and a second asserting circuitry section data signal.

18. The method of claim 14, comprising the step of:

deasserting, by deasserting circuitry of a second latch, a state on one of first and second nodes of a memory of a second latch responsive to one the state of the first latch memory nodes, wherein the deassetting is timed by gating circuitry of the second latch deasserting circuitry responsive to a second latch deasserting circuitry clock signal; and asserting, by asserting circuitry of the second latch, a state on the other one of the second latch memory nodes responsive to the state of the other one of the first latch memory nodes, wherein the asserting is timed by gating circuitry of the second latch asserting circuitry responsive to a second latch asserting circuitry clock signal.

* * * * *